United States Patent
Xu

(10) Patent No.: US 12,405,737 B2
(45) Date of Patent: Sep. 2, 2025

(54) ADAPTIVE GENERATION OF MEMORY PARTITIONS

(71) Applicant: Micron Technology, Inc., Boise, ID (US)

(72) Inventor: Zhongguang Xu, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 50 days.

(21) Appl. No.: 18/383,729

(22) Filed: Oct. 25, 2023

(65) Prior Publication Data

US 2024/0152287 A1    May 9, 2024

Related U.S. Application Data

(60) Provisional application No. 63/423,713, filed on Nov. 8, 2022.

(51) Int. Cl.
*G06F 3/06* (2006.01)

(52) U.S. Cl.
CPC .......... *G06F 3/0634* (2013.01); *G06F 3/0604* (2013.01); *G06F 3/0644* (2013.01); *G06F 3/0679* (2013.01)

(58) Field of Classification Search
CPC ...... G06F 3/0634; G06F 3/0604; G06F 3/064; G06F 3/0679
USPC .......................................... 711/103
See application file for complete search history.

(56) References Cited

U.S. PATENT DOCUMENTS

| | | | |
|---|---|---|---|
| 6,185,666 B1 * | 2/2001 | Murray | G06F 3/0674 713/100 |
| 6,253,300 B1 * | 6/2001 | Lawrence | G11B 20/1217 711/112 |
| 9,021,181 B1 * | 4/2015 | Rotbard | G06F 3/0679 711/119 |
| 9,052,831 B1 * | 6/2015 | Stefani | G06F 3/0644 |
| 2003/0023867 A1 * | 1/2003 | Thibadeau | G06F 3/0644 713/165 |
| 2016/0307646 A1 * | 10/2016 | Squires | G06F 11/3485 |
| 2020/0057578 A1 * | 2/2020 | Benisty | G06F 3/064 |
| 2020/0167361 A1 * | 5/2020 | Princehouse | G06F 3/0649 |
| 2021/0149578 A1 * | 5/2021 | Xu | H04L 41/0806 |
| 2021/0157720 A1 * | 5/2021 | Bert | G06F 3/0608 |
| 2021/0208808 A1 * | 7/2021 | Gupta | G06F 3/0673 |
| 2021/0271572 A1 * | 9/2021 | Qi | G06F 3/0619 |
| 2022/0004320 A1 * | 1/2022 | Matosevich | G06F 3/0659 |

(Continued)

*Primary Examiner* — Reginald G Bragdon
*Assistant Examiner* — Aaron D Ho
(74) *Attorney, Agent, or Firm* — Schwegman Lundberg & Woessner, P.A.

(57) ABSTRACT

Aspects of the present disclosure configure a system component, such as a memory sub-system controller, to perform adaptive read level threshold voltage operations. The controller receives a request to program data into an individual portion of the set of memory components and determines whether the request comprises host data or non-user targeted space (NUTS) data. The controller conditionally defines a partition for the individual portion of the set of memory components based on whether the request comprises host data or the NUTS data. The controller associates the partition with a bin of a plurality of bins, each of the plurality of bins representing an individual read level offset used to access a charge distribution of data stored in the individual portion of the set of memory components.

20 Claims, 7 Drawing Sheets

(56) References Cited

U.S. PATENT DOCUMENTS

| | | | | |
|---|---|---|---|---|
| 2022/0137815 A1* | 5/2022 | Nowell | ............... | G11C 29/028 |
| | | | | 711/103 |
| 2022/0164106 A1* | 5/2022 | Nowell | ................. | G11C 16/32 |
| 2022/0189545 A1* | 6/2022 | Muchherla | ......... | G11C 16/0483 |
| 2022/0300186 A1* | 9/2022 | Muchherla | ............ | G06F 3/0653 |
| 2022/0334752 A1* | 10/2022 | Muchherla | ............ | G06F 3/0655 |
| 2022/0336023 A1* | 10/2022 | Muchherla | ............ | G11C 16/102 |
| 2023/0017602 A1* | 1/2023 | Shen | ................ | G06F 3/0619 |
| 2023/0043877 A1* | 2/2023 | Xu | ..................... | G11C 13/0035 |
| 2023/0050305 A1* | 2/2023 | Xu | ..................... | G11C 16/3404 |
| 2023/0153032 A1* | 5/2023 | Shin | ...................... | G06F 3/0611 |
| | | | | 711/154 |
| 2023/0195379 A1* | 6/2023 | Kientz | ................. | G06F 3/0658 |
| | | | | 711/154 |
| 2023/0266904 A1* | 8/2023 | Kientz | ................... | G11C 16/26 |
| 2023/0267986 A1* | 8/2023 | Kientz | ................ | G11C 29/021 |
| | | | | 365/191 |
| 2023/0418475 A1* | 12/2023 | Shukla | ................. | G06F 3/0619 |
| 2024/0062835 A1* | 2/2024 | Rayaprolu | ............ | G11C 16/26 |
| 2024/0231632 A1* | 7/2024 | Kim | ..................... | G06F 3/0659 |

* cited by examiner

ADAPTIVE GENERATION OF MEMORY PARTITIONS

PRIORITY APPLICATION

This application claims the benefit of priority to U.S. Provisional Application Ser. No. 63/423,713, filed Nov. 8, 2022, which is incorporated herein by reference in its entirety.

TECHNICAL FIELD

Embodiments of the disclosure relate generally to memory sub-systems and, more specifically, to performing adaptive memory read level threshold operations in a memory sub-system.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
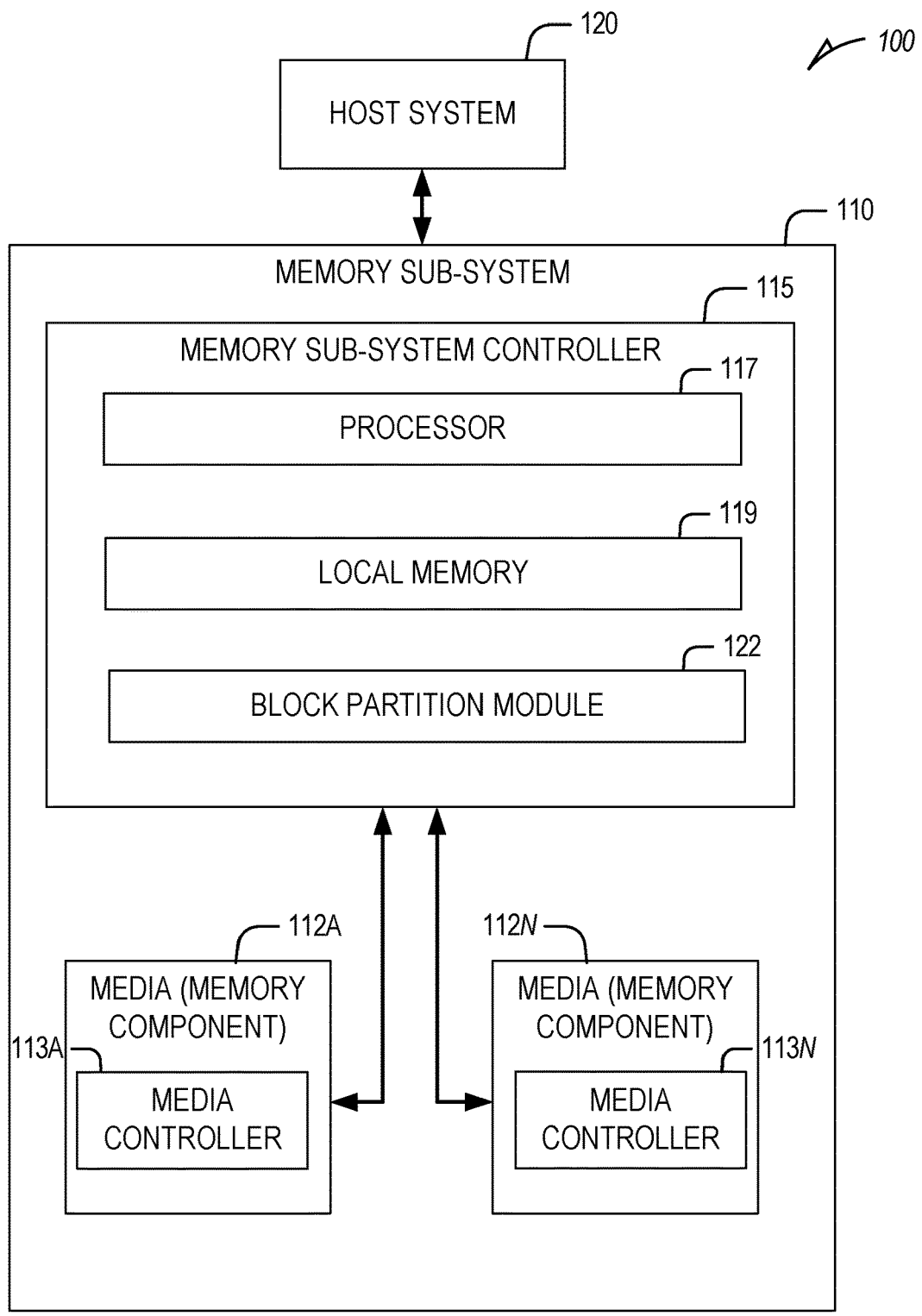
FIG. 1 is a block diagram illustrating an example computing environment including a memory sub-system, in accordance with some embodiments of the present disclosure.

Aspects of the present disclosure configure a system component, such as a memory sub-system controller, to perform adaptive read level threshold voltage operations for a memory sub-system. The memory sub-system controller can condition the closing and generation of memory block partitions on the basis of the type of data being stored in the memory block (e.g., host data or non-user targeted space (NUTS) data). The partitions can be associated with different bins, each of which represents an individual read level threshold voltage offset used to access a charge distribution of data stored in the individual portion of the set of memory components. If NUTS data is being stored to a memory block, a partition timer is not started until host data is stored. After storing the NUTS data, once host data starts being stored to the memory block, the partition timer is started to set a closing time for the partition to control the association of the partition with the different bins. In this way, a partition can remain open to allow additional data to be stored despite NUTS data being initially stored in the memory block. By conditioning the timer for controlling when a partition is closed and associated with bins used to determine the read level threshold voltage on the type of data being stored, the number of PE cycles that are performed for the memory block are reduced and the efficiency at which data is stored is increased, which improves the overall efficiency of operating the memory sub-system.

A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components, such as memory devices that store data. The host system can send access requests (e.g., write command, read command, sequential write command, sequential read command) to the memory sub-system, such as to store data at the memory sub-system and to read data from the memory sub-system. The data specified by the host is hereinafter referred to as "host data" or "user data".

A host request can include logical address information (e.g., logical block address (LBA), namespace) for the host data, which is the location the host system associates with the host data and a particular zone in which to store or access the host data. The logical address information (e.g., LBA, namespace) can be part of metadata for the host data. Metadata can also include error handling data (e.g., ECC codeword, parity code), data version (e.g., used to distinguish age of data written), valid bitmap (which LBAs or logical transfer units contain valid data), etc.

The memory sub-system can initiate media management operations, such as a write operation, on host data that is stored on a memory device. For example, firmware of the memory sub-system may re-write previously written host data from a location on a memory device to a new location as part of garbage collection management operations. The data that is re-written, for example as initiated by the firmware, is hereinafter referred to as "garbage collection data".

"User data" can include host data and garbage collection data. "System data" hereinafter refers to data that is created and/or maintained by the memory sub-system for performing operations in response to host requests and for media management. Examples of system data include, and are not limited to, system tables (e.g., logical-to-physical address mapping table), data from logging, scratch pad data, NUTS data, etc.

A memory device can be a non-volatile memory device. A non-volatile memory device is a package of one or more dice. Each die can comprise one or more planes. For some types of non-volatile memory devices (e.g., NAND devices), each plane comprises a set of physical blocks. For some memory devices, blocks are the smallest area that can be erased. Each block comprises a set of pages. Each page comprises a set of memory cells, which store bits of data. The memory devices can be raw memory devices (e.g., NAND), which are managed externally, for example, by an external controller. The memory devices can be managed memory devices (e.g., managed NAND), which is a raw memory device combined with a local embedded controller for memory management within the same memory device package. The memory device can be divided into one or more zones where each zone is associated with a different set of host data or user data or application.

Typical memory systems leverage superblocks, which are a collection of blocks across memory planes and/or dies. Namely, each superblock can be of equal size and can include a respective collection of blocks across multiple planes and/or dies. The superblocks, when allocated, allow a controller to simultaneously write data to a large portion of memory spanning multiple blocks (across multiple planes and/or dies) with a single address.

Conventional memory sub-systems store data in memory components (e.g., blocks or superblocks) by forming partitions across portions of the memory. Specifically, the conventional memory sub-systems can start programming or storing data to an individual portion of the memory, such as a block or superblock, and associate that individual portion with a bin representing a first memory real level threshold voltage (e.g., a first offset from a default read level). The conventional memory sub-systems continue storing data to the individual portion and associate all of the data stored to the individual portion until a partition closing time elapses. At that point, all of the data stored in the individual portion forms a partition that is associated with the same bin, and further data can no longer be written to the partition. Subsequent data that is requested to be stored is programmed to other partitions or regions of the memory sub-system. The closing time of the partitions of memory is usually predetermined and the same across all the memory blocks. The closing time is usually set based on the end-of-life or worst-case operations of the memory sub-system.

Conventional memory sub-systems do not distinguish between types of data being written to the blocks or superblocks when initiating the timer for closing the partitions. This means that if NUTS data (or system data) is being stored to a given block or superblock, that region in which the NUTS data is stored will be closed after the predetermined time period that controls the closing time. Such NUTS data is usually of a very small size, spanning only a few pages, which means the partition that is generated to include the small amount of NUTS data will also be of a very small size, cause wasted space, and the quantity of overall partitions generated for the block or superblock will increase. Managing a large quantity of partitions for a block can introduce various inefficiencies in performance, such as in random read operations and critical folding operations. Specifically, when the partition that includes only the NUTS data reaches a final bin (e.g., a last read offset level of a set of read offset levels after a maximum specified period of time), the entire block may need to be refreshed, placed in garbage collection, or folded, which introduces inefficiencies in the memory system. Also, if a list of free blocks reaches a minimum threshold quantity, a block that is in garbage collection (e.g., as a result of having a small partition that reaches a final bin), will need to be erased, which takes time and can also introduce inefficiencies. In addition, adding an erase cycle to a block on the basis of having such a small partition can reduce the overall life of the memory sub-systems.

Aspects of the present disclosure address the above and other deficiencies by configuring a system component, such as a memory sub-system controller, to tailor when partitions of different portions of a set of memory components are created (e.g., when a closing timer for a partition is started) based on a type of data (e.g., host versus NUTS data) being stored in the portions. In this way, partitions are created if host data is being programmed and are not created if NUTS data is being programmed. If NUTS data is being programmed, rather than creating a partition for the NUTS data to control the read level used to read the NUTS data, the NUTS data is associated with a default read level threshold and/or associated with a read level of a subsequent partition that does include host data. This can reduce the number of PE cycles that are performed for the portion and improves the efficiency at which data is stored, which improves the overall efficiency of operating the memory sub-system.

In some examples, the memory controller is operatively coupled to a set of memory components and is configured to receive a request to program data into an individual portion of the set of memory components. The controller determines whether the request includes host data or NUTS data and conditionally defines a partition for the individual portion of the set of memory components based on whether the request includes host data or the NUTS data. The controller associates the partition with a bin of a plurality of bins, each of the plurality of bins representing an individual read level offset used to access a charge distribution of data stored in the individual portion of the set of memory components.

In some examples, the controller determines that the request includes the host data. In such cases, in response to determining that the request includes the host data, the controller closes the partition after a specified time interval. In some examples, the bin is a first bin representing a first read level offset, and the controller determines that the time interval associated with the bin has elapsed since a collection of data including the host data was initially programmed in the partition. In response to determining that the time interval associated with the bin has elapsed, the controller associates the partition with a second bin of the plurality of bins, the second bin representing a second read level offset.

In some examples, the controller prevents additional data from being stored in the partition of the individual portion of the set of memory components in response to determining that the partition has been closed. In some examples, the partition is a first partition, and the controller receives a request to write additional host data to the individual portion of the set of memory components after the first partition has been closed. In response to receiving the request to write the additional host data, the controller programs the additional host data to a second partition of the individual portion of the set of memory components.

In some examples, the controller initiates a timer for the second partition in response to receiving the request to program the additional host data. The controller closes the second partition in response to determining that the timer has reached the specified time interval. In some aspects, the partition is a first partition, and the controller receives a request to write additional NUTS data to the individual portion of the set of memory components after the first partition has been closed. In response to receiving the request to write the additional NUTS data, the controller programs the additional NUTS data to a region of the individual portion of the set of memory components that follows the first partition.

In some examples, the controller identifies an individual bin of the plurality of bins associated with a partition that is programmed in the individual portion following the region in which the additional NUTS data is programmed. The controller associates the individual bin with the region in which the additional NUTS data is programmed. In some examples, the controller reads the additional NUTS data from the region using a read level offset defined by the individual bin. In some examples, the controller determines that the request includes the NUTS data. In response to determining that the request includes the NUTS data, the controller programs the NUTS data into a region of the individual portion.

In some examples, the controller determines whether any host data is stored in the individual portion prior to a specified time period. In response to determining that no host data has been stored in the individual portion prior to the specified time period, the controller folds the individual portion to refresh the region that includes the NUTS data. In some examples, the controller determines whether any host data is stored in the individual portion prior to a specified time period. In response to determining that a set of host data has been stored in the individual portion prior to the specified time period, the controller associates the region of the individual portion with an individual bin of the plurality of bins corresponding to the set of host data.

In some examples, the controller determines that the set of host data has been programmed into the partition prior to programming the NUTS data and determines that NUTS data has been programmed prior to a closing time of the partition into which the set of host data has been programmed. The controller defines the partition to include the set of host data and the NUTS data, such that the set of host data and the NUTS data are associated with the individual bin. In some aspects, the controller determines that the set of host data has been programmed into an individual partition of the individual portion after programming the NUTS data and identifies the individual bin of the plurality of bins associated with an individual partition including the set of host data. In such cases, the controller associates the individual bin with the region in which the NUTS data is programmed.

In some implementations, the individual portion includes a superblock including a plurality of memory blocks across a plurality of memory dies. In some implementations, the memory sub-system includes a three-dimensional NAND storage device. In some implementations, the controller generates the partition for the individual portion in response to receiving the request to program host data. In some implementations, the controller skips one or more pages of the individual portion that include NUTS data during at least one of a media scan operation or a read disturb scan operation.

Though various embodiments are described herein as being implemented with respect to a memory sub-system (e.g., a controller of the memory sub-system), some or all of the portions of an embodiment can be implemented with respect to a host system, such as a software application or an operating system of the host system.

FIG. 1 illustrates an example computing environment 100 including a memory sub-system 110, in accordance with some examples of the present disclosure. The memory sub-system 110 can include media, such as memory components 112A to 112N (also hereinafter referred to as "memory devices"). The memory components 112A to 112N can be volatile memory devices, non-volatile memory devices, or a combination of such. In some embodiments, the memory sub-system 110 is a storage system. A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to a memory system. The memory system can include one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. Examples of a physical host interface include, but are not limited to, a serial advanced technology attachment (SATA) interface, a peripheral component interconnect express (PCIe) interface, a universal serial bus (USB) interface, a Fibre Channel interface, a Serial Attached SCSI (SAS) interface, etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals (e.g., download and commit firmware commands/requests) between the memory sub-system 110 and the host system 120.

The memory components 112A to 112N can include any combination of the different types of non-volatile memory components and/or volatile memory components. An example of non-volatile memory components includes a negative- and (NAND)-type flash memory. Each of the memory components 112A to 112N can include one or more arrays of memory cells such as single-level cells (SLCs) or multi-level cells (MLCs) (e.g., TLCs or QLCs). In some embodiments, a particular memory component 112 can include both an SLC portion and an MLC portion of memory cells. Each of the memory cells can store one or more bits of data (e.g., blocks) used by the host system 120. Although non-volatile memory components such as NAND-type flash memory are described, the memory components 112A to 112N can be based on any other type of memory, such as a volatile memory.

In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magnetoresistive random access memory (MRAM), negative-or (NOR) flash memory, electrically erasable programmable read-only memory (EEPROM), three-dimensional (3D) NAND, and a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write-in-place operation, where a non-volatile memory cell can be programmed without the non-volatile memory cell being previously erased. Furthermore, the memory cells of the memory components 112A to 112N can be grouped as memory pages, blocks, or superblocks that can refer to a unit (or portion) of the memory component 112 used to store data.

The memory sub-system controller 115 can communicate with the memory components 112A to 112N to perform operations such as reading data, writing data, or erasing data at the memory components 112A to 112N and other such operations. The memory sub-system controller 115 can include hardware such as one or more integrated circuits and/or discrete components, a buffer memory, or a combination thereof. The memory sub-system controller 115 can be a microcontroller, special-purpose logic circuitry (e.g., a field programmable gate array (FPGA), an application specific integrated circuit (ASIC), etc.), or another suitable processor. The memory sub-system controller 115 can include a processor 117 (processing device) configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, and so forth. The local memory 119 can also include read-only memory (ROM) for storing microcode. While the example memory sub-system 110 in FIG. 1 has been illustrated as including the memory sub-system controller 115, in another embodiment of the present disclosure, a memory sub-system 110 may not include a memory sub-system controller 115, and can instead rely upon external control (e.g., provided by an external host, or by a processor 117 or controller separate from the memory sub-system 110).

In general, the memory sub-system controller 115 can receive I/O commands or operations from the host system 120 and can convert the commands or operations into instructions or appropriate commands to achieve the desired access to the memory components 112A to 112N. The memory sub-system controller 115 can be responsible for other operations, based on instructions stored in firmware, such as wear leveling operations, garbage collection operations, error detection and ECC operations, decoding operations, encryption operations, caching operations, address translations between a logical block address and a physical block address that are associated with the memory components 112A to 112N, address translations between an application identifier received from the host system 120 and a corresponding zone of a set of zones of the memory components 112A to 112N. This can be used to restrict applications to reading and writing data only to/from a corresponding zone of the set of zones that is associated with the respective applications. In such cases, even though there may be free space elsewhere on the memory components 112A to 112N, a given application can only read/write data to/from the associated zone, such as by erasing data stored in the zone and writing new data to the zone. The memory sub-system controller 115 can further include host interface circuitry to communicate with the host system 120 via the physical host interface. The host interface circuitry can convert the I/O commands received from the host system 120 into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM or other temporary storage location or device) and address circuitry (e.g., a row decoder and a column decoder) that can receive an address from the memory sub-system controller 115 and decode the address to access the memory components 112A to 112N.

The memory devices can be raw memory devices (e.g., NAND), which are managed externally, for example, by an external controller (e.g., memory sub-system controller 115). The memory devices can be managed memory devices (e.g., managed NAND), which is a raw memory device combined with a local embedded controller (e.g., local media controllers) for memory management within the same memory device package. Any one of the memory components 112A to 112N can include a media controller (e.g., media controller 113A and media controller 113N) to manage the memory cells of the memory component, to communicate with the memory sub-system controller 115, and to execute memory requests (e.g., read or write) received from the memory sub-system controller 115.

In some embodiments, the memory sub-system controller 115 can include a block partition module 122. The block partition module 122 can include sense circuitry, such as sense amplifiers, configured to determine the values of data on (e.g., read), or to determine the values of data to be written to, memory cells of the set of memory components 112A to 112N. For example, in a selected string of memory cells, one or more of the sense amplifiers can read a logic level in the selected memory cell in response to a read current (charge distribution) flowing in the memory array through the selected string to the data lines. In some cases, the read current (charge distribution) is compared to a read trim value (also referred to as a read level threshold voltage) or level, and based on whether the read current (charge distribution) exceeds or transgresses the read trim value, the corresponding logic level can be determined. In some cases, the read level threshold controls the read level used to read the charge stored in a given cell. Over time the charge distribution stored in the cell can leak and so the read level threshold can be combined with a positive or negative offset to adjust for such leakage and to accurately read the charge distribution.

While certain embodiments refer to a comparison to a read level threshold voltage, similar techniques can be applied to comparing the read current to a read level threshold current. Over time, the current and/or voltage (charge distribution) that is stored by the string of memory cells can degrade and leak. This results in an increase in the bit error rate when the data is read using a specific trim value or read by applying a specific read level threshold voltage to a cell to obtain the stored charge distribution. To address these issues, the disclosed techniques adaptively modify the trim value or offset applied to the read level based on the duration of time the data (charge distribution) has been stored by the memory cells. In some examples, the trim value is increased and in other cases the trim value is decreased. This improves the ability to accurately convert charge distributions stored by the memory cells to the logical value or logical level, which reduces the bit error rate.

In order to accurately modify the trim values at the optimal or most efficient time and manner, the block partition module 122 can tailor when partitions of different portions of a set of memory components are closed (e.g., the closing times of the partitions) on the basis of the type of data being stored in the partitions. The closing of the partitions determines which bins (e.g., trim values, read level offsets, or read level threshold voltage values) are used to read data from the partitions. In this way, the duration of time that data can be written to a portion of the set of memory components before the portion is closed and the bin (e.g., representing read level threshold voltage) associated with the portion is updated is controlled based on whether NUTS data or host data is stored to the portion forming a partition. This can reduce the number of PE cycles that are performed for the portion and improves the efficiency at which data is stored, which improves the overall efficiency of operating the memory sub-system 110.

For example, the block partition module 122 can determine that a request to program data includes host data. In such cases, the block partition module 122 can store the host data to an empty region of a particular memory component 112 and can initiate a timer for closing the region in which the host data is stored. Namely, the block partition module 122 can continue storing additional host data and NUTS data to the particular memory component 112 until the timer reaches a closing time. At that point, the block partition module 122 closes the partition that includes the host data and, optionally NUTS data, and associates the partition with a first bin of a set of bins. The block partition module 122 prevents storing additional data to the partition after the partition is closed. In this way, the block partition module 122 controls any subsequent read operations to the region containing the partition using the read level offset defined by the current bin associated with the partition. Namely, if the read request is received when the partition is associated with the first bin, a first read level offset can be used to read the charge distribution from the partition.

After a specified time period, the partition including the host data and/or the NUTS data is associated with a second bin adjacent to the first bin that defines a second read level offset. If the read request to read the data stored in the partition is received when the partition is associated with the second bin, the second read level offset is used to retrieve the charge distribution and read the data stored in the partition.

In some examples, the block partition module 122 can determine that the request to program data includes NUTS data. In such cases, the block partition module 122 can store the NUTS data to an empty region of the particular memory component 112. The block partition module 122 in this case does not initiate a timer for closing the partition. Rather the block partition module 122 waits until host data is received and stored in the region subsequent to the NUTS data before starting a timer for closing the partition that includes the host data. The block partition module 122 can control the read level used to read the NUTS data based on whether the NUTS data is stored in a partition that includes host data or if the NUTS data is stored in a region adjacent to a partition that includes host data.

In some cases, the block partition module 122 can determine whether the empty region is part of a partition that includes host data that has not yet been closed. For example, the block partition module 122 can determine that the NUTS data has been received while a timer for closing an already open partition has not yet reached the closing time threshold. In such cases, the block partition module 122 includes the NUTS data in the same partition that is still open and includes the NUTS data in the partition when the partition is closed. In such cases, the NUTS data can be read using a read level offset that corresponds to and is the same as the read level offset used to read all of the other host data stored in the same partition, as defined by the corresponding bin.

The block partition module 122 can determine that the NUTS data has been stored to a region that is adjacent to a partition that includes the host data. In such cases, the block partition module 122 accesses the bin corresponding to the adjacent region (e.g., the immediately preceding partition (stored in earlier or lower word lines) or the immediately following partition (stored in later or higher word lines)) to obtain the read level offset defined by the bin. The block partition module 122 uses the read level offset of the partition in which the host data has been stored to read the NUTS data. In this way, the NUTS data can be stored to the block in some region at a first point in time. After a period of time greater than a predefined partition closing time elapses following the first point in time, the block partition module 122 can store host data to a subsequent region. A partition can be defined to include the host data stored in the subsequent region based on expiration of a timer (e.g., a timer reaching a closing time threshold). The partition can be associated with a bin and can be moved to later bins or adjacent bins as time progresses and if needed. The NUTS data can be read using the bin corresponding to the partition that includes the host data even though the NUTS data was stored before the host data was stored in the region corresponding to the partition and was stored before the timer was initiated for closing the partition that includes the host data. If the NUTS data is stored in a region of the block which is not adjacent to any other host data, the block partition module 122 can apply a default read level offset (e.g., corresponding to any one of the bins in a list of bins) to read the NUTS data.

Depending on the embodiment, the block partition module 122 can comprise logic (e.g., a set of transitory or non-transitory machine instructions, such as firmware) or one or more components that causes the memory sub-system 110 (e.g., the memory sub-system controller 115) to perform operations described herein with respect to the block partition module 122. The block partition module 122 can comprise a tangible or non-tangible unit capable of performing operations described herein.

Figure 2:
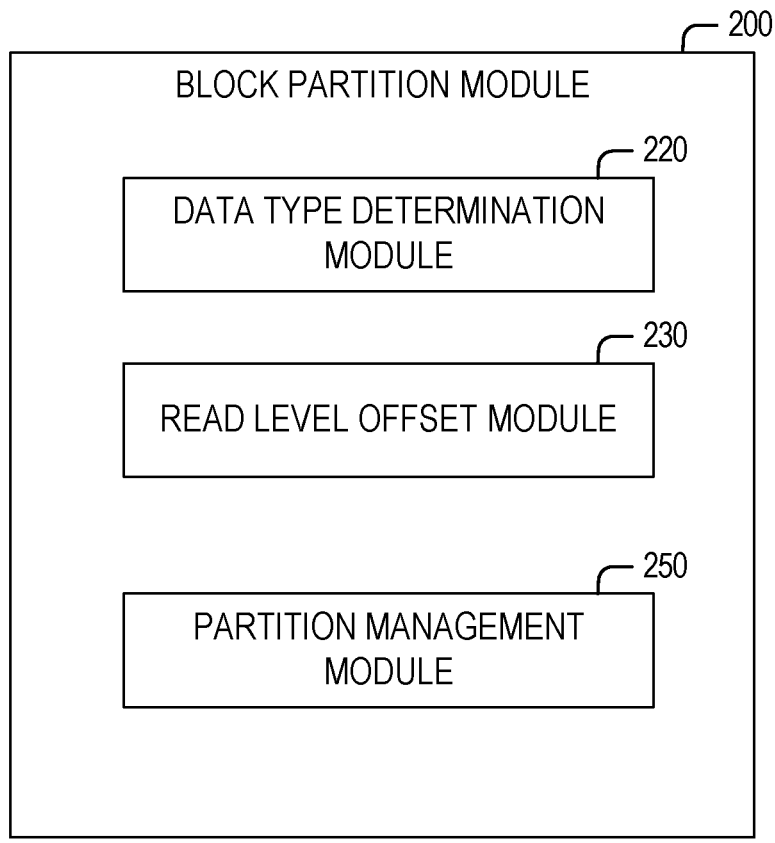
FIG. 2 is a block diagram of an example block partition module, in accordance with some implementations of the present disclosure.

FIG. 2 is a block diagram of an example block partition module 200, in accordance with some implementations of the present disclosure. The block partition module 200 can represent the block partition module 122 of FIG. 1. As illustrated, the block partition module 200 includes a data type determination module 220, a read level offset module 230, and a partition management module 250.

The partition management module 250 can receive a request to write or program data into a portion of the set of memory components 112A to 112N (also referred to collectively or individually as a particular or individual memory component 112). For example, the partition management module 250 can receive a request from the host system 120 to write data to a block or superblock of the set of memory components 112A to 112N. The partition management module 250 can communicate with the data type determination module 220 to determine the type of data associated with the request. For example, the data type determination module 220 can indicate whether the data is NUTS data or host data. The data type determination module 220 can also indicate whether the data is of a type for which a partition closing time needs to be started or initiated or whether the data is of a type that can be stored without generating a partition. In this way, the data type determination module 220 conditionally controls and conditions the generation of a partition in the particular memory component 112 based on the data type.

The partition management module 250 can determine whether a partition of the portion of the set of memory components 112A to 112N is currently open or closed. Specifically, the partition management module 250 determines whether a partition timer or timer that controls closing of partitions is currently running and has not reached a closing time threshold. If the partition is open, the partition management module 250 stores the data received in the request (regardless of its type, such as host data and/or NUTS data) to one or more pages of the portion of the set of memory components 112A to 112N. The partition management module 250 continues writing data to the same partition until the timer reaches the threshold and the partition is closed. Any data (regardless of type) that is written to the same partition is associated with a same bin. The bin can define or represent a read level threshold voltage or read level offset that is used to read a charge distribution stored in the partition to determine the corresponding logical value or level. The partition management module 250 can transition the bin associated with the partition over time based on a bin transition table.

Figure 3:
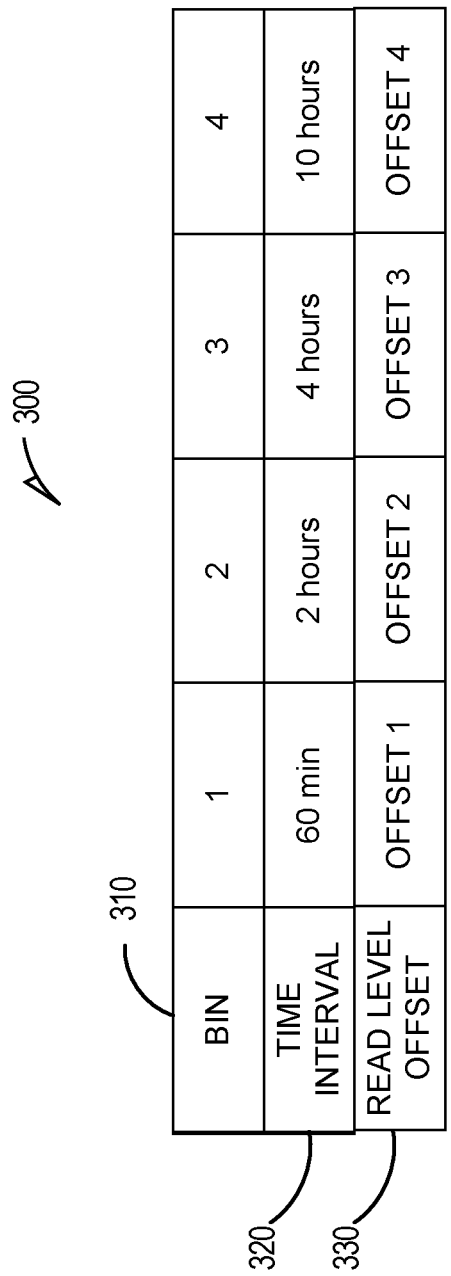
FIG. 3 is a block diagram of an example bin transition and read level offset table, in accordance with some implementations of the present disclosure.

FIG. 3 is a block diagram of an example bin transition and read level offset table 300, in accordance with some implementations of the present disclosure. The table 300 includes a plurality of bins 310 (e.g., BIN 1, BIN 2, BIN 3, and BIN 4). Each bin is associated with a respective time interval 320 and a respective read level offset 330. Initially, when a partition is closed, the partition is associated with the first bin (e.g., BIN 1). Any data read from the partition while the partition is associated with the first bin is read using a read level offset defined by the respective read level offset 330 (e.g., OFFSET 1). After the time interval defined by the respective time interval 320 for the first bin elapses (e.g., after 60 minutes), the partition is transitioned to be associated with an adjacent second bin (e.g., BIN 2) if needed. Namely, if the partition management module 250 determines that the current voltage threshold of the assigned bin for a given partition fails to properly read data from the given partition, the partition management module 250 transitions the given partition to an adjacent bin (e.g., from BIN 1 to BIN 2).

Any data read from the partition while the partition is associated with the second bin is read using a read level offset defined by the respective read level offset 330 (e.g., OFFSET 2). After the time interval defined by the respective time interval 320 for the second bin elapses (e.g., after 2 hours), the partition is transitioned to be associated with an adjacent third bin (e.g., BIN 3).

The partition management module 250 can start a timer when a collection of data is initially written to the partition for the first time. The partition management module 250 can compare the current timer value to a specified closing time. In response to determining that the timer fails to transgress the specified closing time associated with the portion of the set of memory components 112A to 112N, the partition management module 250 continues writing new data to the same partition and continues to associate the partition with the first bin (e.g., BIN 1). The first bin can represent a first read level threshold voltage or offset used to read a charge distribution from a particular memory component 112. In response to determining that the timer transgresses the specified closing time (which can be the time interval of the first bin) associated with the portion of the set of memory components 112A to 112N, the partition management module 250 closes the partition and prevents new data from being written to the closed partition. Subsequently received data, such as host data, is written to a new partition. Subsequently received NUTS data is written to a region of the particular memory component 112 that is not associated with any partition and for which a partition remains undefined.

All the data that has been stored in the closed partition can be associated with the same bin (e.g., the first bin) until the partition management module 250 determines the need to associate the closed partition with a new bin (e.g., a second bin), such as after a threshold period of time. In some examples, data that is stored in the partition can be read from the partition using a first bin (e.g., a first read threshold voltage offset) until the partition is closed. Once the partition is closed, the data can be read from the partition using a second bin (e.g., a second read threshold voltage offset), if needed. Namely, the read level offset module 230 can periodically check the voltage threshold after the partition is closed, such as every 15-30 minutes, to determine whether or not to update the read bin for the data to be associated with the second bin. For example, the read level offset module 230 can receive a request to read data from the portion of the set of memory components 112A to 112N. In response, the read level offset module 230 accesses the bin associated with the portion of the set of memory components 112A to 112N to determine a read level offset associated with the portion of the set of memory components 112A to 112N. The read level offset module 230 then reads the portion of the set of memory components 112A to 112N based on the read level defined by the bin.

In some examples, the partition management module 250 receives a request to write data to the same portion of the set of memory components 112A to 112N that includes the closed partition. For example, the host system 120 can request to write additional data to the same superblock that includes the previously closed partition. In response, the partition management module 250 can start writing the data to a new partition and initiate a timer for the new partition to determine when to close the new partition. The partition management module 250 can associate the new partition with the first bin and can associate the closed partition with the second bin. In this way, the partition management module 250 can read data from the closed partition using the second read level threshold voltage offset corresponding to the second bin and can read data from the new partition using the first read level threshold voltage offset corresponding to the first bin.

In some examples, the partition management module 250 receives a request to read NUTS data that was stored after a particular partition of the portion of the set of memory components 112A to 112N has been closed. In such cases, the partition management module 250 determines whether a subsequent partition that includes host data has been defined in a region of the portion of the set of memory components 112A to 112N that follows the region in which the NUTS data was stored. If so, the partition management module 250 identifies the current bin associated with the subsequent partition that includes the host data and obtains the read level offset defined by the current bin. The partition management module 250 uses the read level offset defined for the current bin of the subsequent partition (which does not include the NUTS data but is defined after the NUTS data was stored) to read the NUTS data. If the partition management module 250 fails to identify a region following the NUTS data that includes host data, the partition management module 250 reads the NUTS data using a default read level offset.

Figure 4:
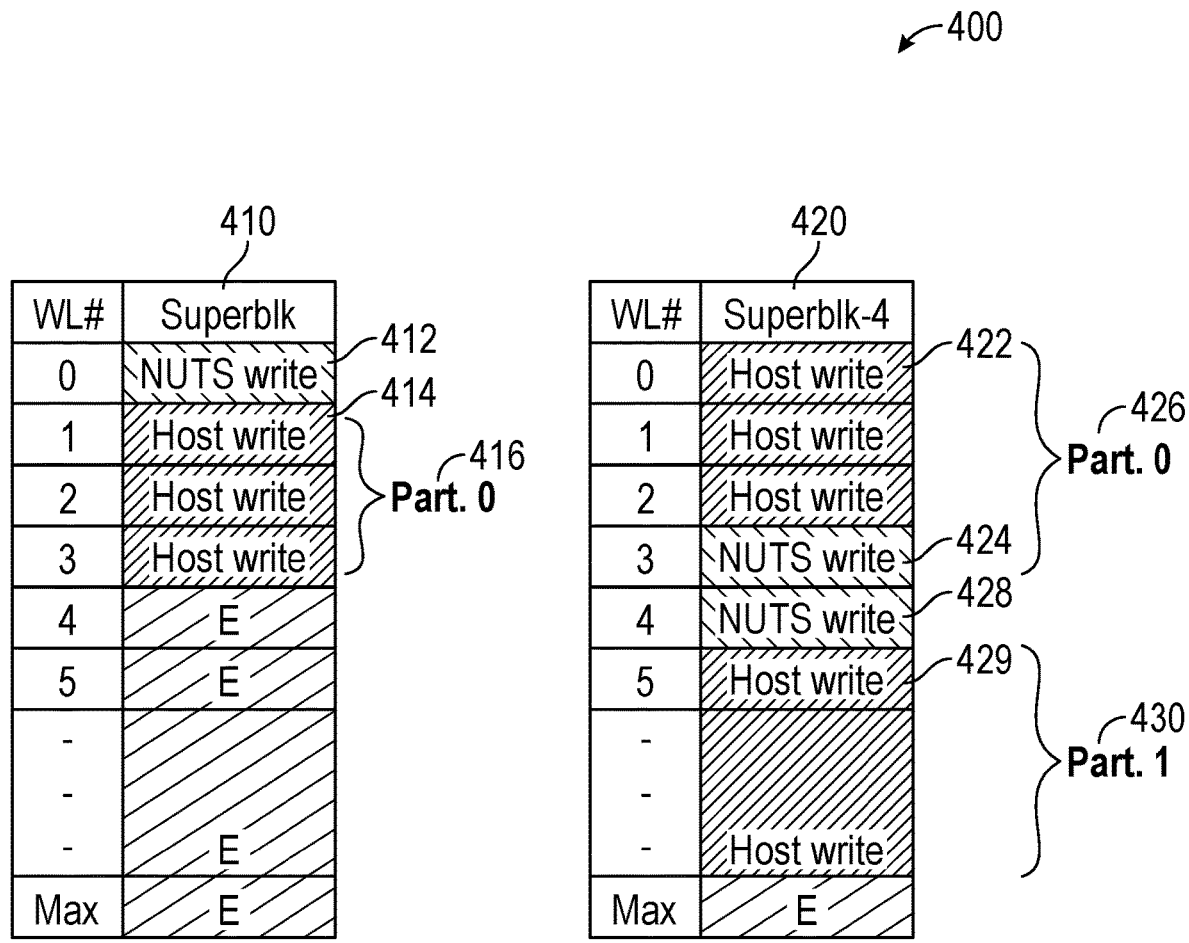
FIG. 4 is an illustrative block partition distribution, in accordance with some implementations of the present disclosure.

FIG. 4 is an illustrative block partition distribution 400, in accordance with some implementations of the present disclosure. For example, the partition management module 250 can receive a request to store a first set of NUTS data in a first block 410. In response, the partition management module 250 can identify the first block 410 and determine that the data type of the first set of NUTS data indicates that a partition for the first set of NUTS data is not to be created. In such cases, the partition management module 250 stores the first set of NUTS data to a first word line 412 of the first block 410. The partition management module 250 does not initiate a timer for closing a partition in response to storing the first set of NUTS data to the first word line 412.

After storing the first set of NUTS data, the partition management module 250 can receive a request to store a first set of host data. This request can be received after or before a time period representing a closing time for a partition elapses or expires. The partition management module 250 determines that the first set of host data corresponds to a data type for which a partition needs to be created. In such cases, the partition management module 250 stores the first set of host data to a set of word lines 414 that follow the first word line 412. The partition management module 250 also initiates a timer for closing the partition 416 in which the first set of host data is stored. The partition management module 250 can continue storing subsequently received host data and/or NUTS data in word lines of the partition that includes the first set of host data until the timer reaches the specified closing time. After the timer reaches the closing time, the partition management module 250 closes the partition 416 that includes the collection of host data and/or NUTS data and associates the partition with a first bin (e.g., BIN 1 or BIN 2) of the bins 310 (FIG. 3).

The partition management module 250 can receive a request to read the first set of NUTS data from the first word line 412, such as after the partition 416 is closed. The partition management module 250 can determine that the NUTS data is not included in any partition. The partition management module 250 can determine that the first word line 412 is adjacent to and precedes the word lines 414 in which the host data has been stored and defines the partition 416. In such cases, the partition management module 250 accesses the current bin associated with the partition 416 to obtain the read level offset of the current bin. The partition management module 250 then reads the first word line 412 using the obtained read level offset currently associated with the partition 416.

The partition management module 250 can receive a request to write or store or program a second set of host data to a second block 420. In response, the partition management module 250 can determine that the second set of host data is of a data type for which a partition needs to be created. In such cases, the partition management module 250 stores the second set of host data to a set of word lines 422 of the second block 420. The partition management module 250 also initiates a timer for closing the partition 426 in which the second set of host data is stored. The partition management module 250 can continue storing subsequently received host data and/or NUTS data in word lines of the partition that includes the second set of host data until the timer reaches the specified closing time. For example, the partition management module 250 can receive a request to store a second set of NUTS data while the timer has not yet reached the closing time for the partition in which the second set of host data is stored. In response, the partition management module 250 stores the second set of NUTS data in a word line 424 that is included in the partition 426 of the second set of host data. After the timer reaches the closing time, the partition management module 250 closes the partition 426 that includes the collection of host data and the second set of NUTS data and associates the partition with a first bin (e.g., BIN 1 or BIN 2) of the bins 310 (FIG. 3).

The partition management module 250 can receive a request to read the second set of NUTS data from the word line 424, such as after the partition 426 is closed. The partition management module 250 can determine that the second set of NUTS data is included in the partition 426. In response, the partition management module 250 accesses the current bin associated with the partition 426 to obtain the read level offset of the current bin. The partition management module 250 then reads the word line 424 using the obtained read level offset currently associated with the partition 426.

After the partition 426 is closed, the partition management module 250 can receive a request to program a third set of NUTS data. The partition management module 250 can determine that there does not exist an open partition to which host data is currently being written. In response, the partition management module 250 stores the third set of NUTS data in a word line 428 that follows the partition 426. The partition management module 250 does not associate the word line 428 with any partition and does not initiate a timer for closing a partition that includes the word line 428.

After storing the third set of NUTS data, the partition management module 250 can receive a request to store a third set of host data. This request can be received after a time period representing a closing time for a partition elapses or expires. The partition management module 250 determines that the third set of host data corresponds to a data type for which a partition needs to be created. In such cases, the partition management module 250 stores the third set of host data to a set of word lines 429 that follow the word line 428 in which the third set of NUTS data has been stored. The partition management module 250 also initiates a timer for closing the partition 430 in which the third set of host data is stored. The partition management module 250 can continue storing subsequently received host data and/or NUTS data in word lines of the partition 430 that includes the third set of host data until the timer reaches the specified closing time. After the timer reaches the closing time, the partition management module 250 closes the partition 430 that includes the collection of host data and/or NUTS data and associates the partition 430 with a first bin (e.g., BIN 1 or BIN 2) of the bins 310 (FIG. 3).

The partition management module 250 can receive a request to read the third set of NUTS data from the word line 428, such as after the partition 430 is closed. The partition management module 250 can determine that the third set of NUTS data is not included in any partition. The partition management module 250 can determine that the word line 428 in which the third set of NUTS data is stored is adjacent to and precedes the word lines 429 in which the third set of host data has been stored and defines the partition 430. In such cases, the partition management module 250 accesses the current bin associated with the partition 430 to obtain the read level offset of the current bin. The partition management module 250 then reads the word line 428 using the obtained read level offset currently associated with the partition 430.

In some cases, the partition management module 250 can receive a request to read the third set of NUTS data from the word line 428, such as before any data is stored in the partition 430. The partition management module 250 can determine that the third set of NUTS data is not included in any partition. In such cases, the partition management module 250 reads the word line 428 using a default read level offset.

Figure 5A:
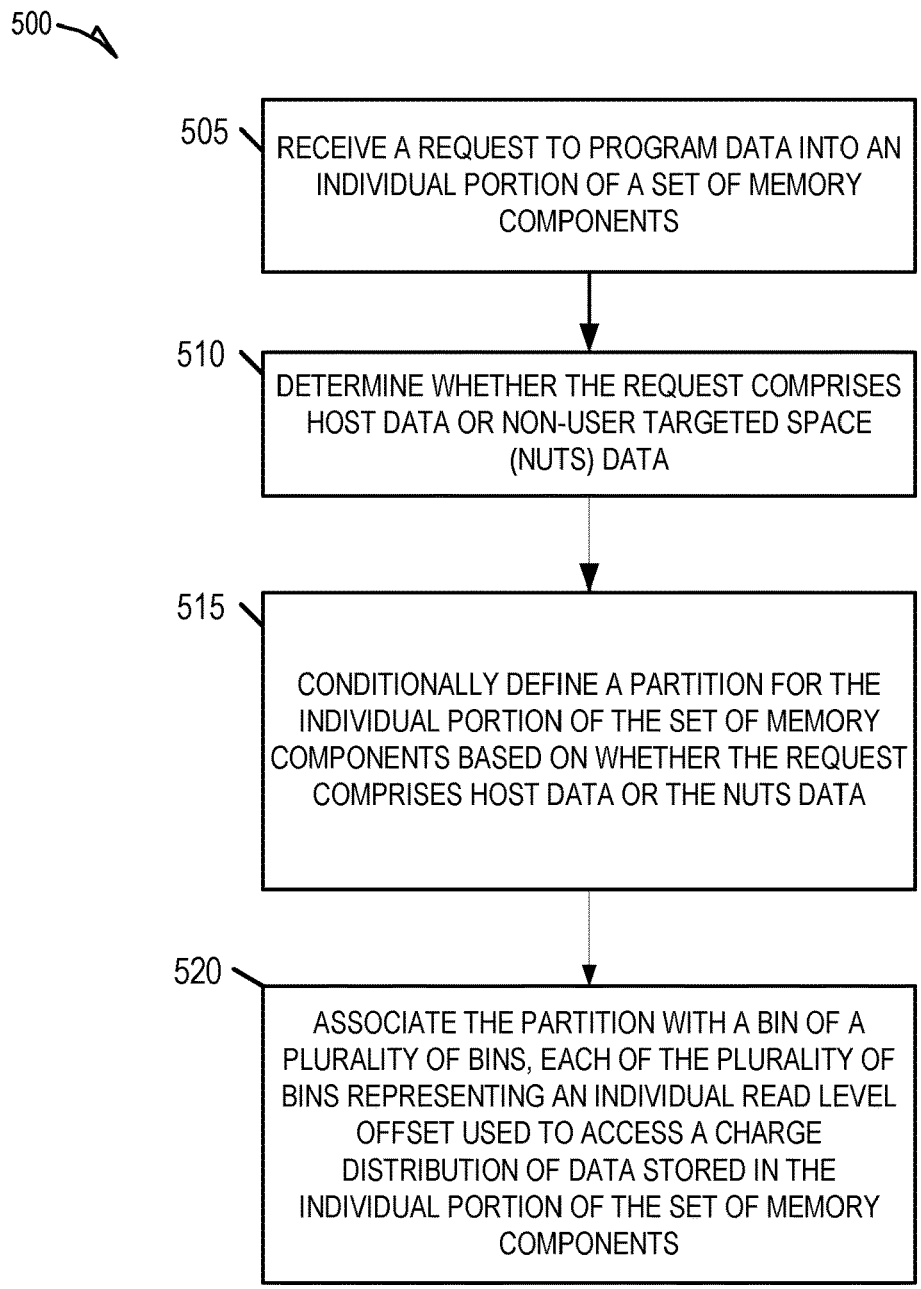
FIGS. 5A and 5B are flow diagrams of example methods to perform adaptive read level threshold voltage operations, in accordance with some implementations of the present disclosure.

FIG. 5A is a flow diagram of an example method 500 to perform adaptive read level threshold voltage operations, in accordance with some implementations of the present disclosure. Method 500 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 500 is performed by the memory sub-system controller 115 or subcomponents of the controller 115 of FIG. 1. In these embodiments, the method 500 can be performed, at least in part, by the block partition module 200. Although the processes are shown in a particular sequence or order, unless otherwise specified, the order of the processes can be modified. Thus, the illustrated embodiments should be understood only as examples; the illustrated processes can be performed in a different order, and some processes can be performed in parallel. Additionally, one or more processes can be omitted in various embodiments. Thus, not all processes are required in every embodiment. Other process flows are possible.

Referring now to FIG. 5A, the method (or process) 500 begins at operation 505, with the block partition module 200 of a memory sub-system (e.g., of processor of the memory sub-system controller 115) receiving a request to program data into an individual portion of a set of memory components. Then, at operation 510, the block partition module 200 determines whether the request comprises host data or non-user targeted space (NUTS) data. The block partition module 200, at operation 515, conditionally defines a partition for the individual portion of the set of memory components based on whether the request comprises host data or the NUTS data and, at operation 520, associates the partition with a bin of a plurality of bins, each of the plurality of bins representing an individual read level offset used to access a charge distribution of data stored in the individual portion of the set of memory components.

Figure 5B:
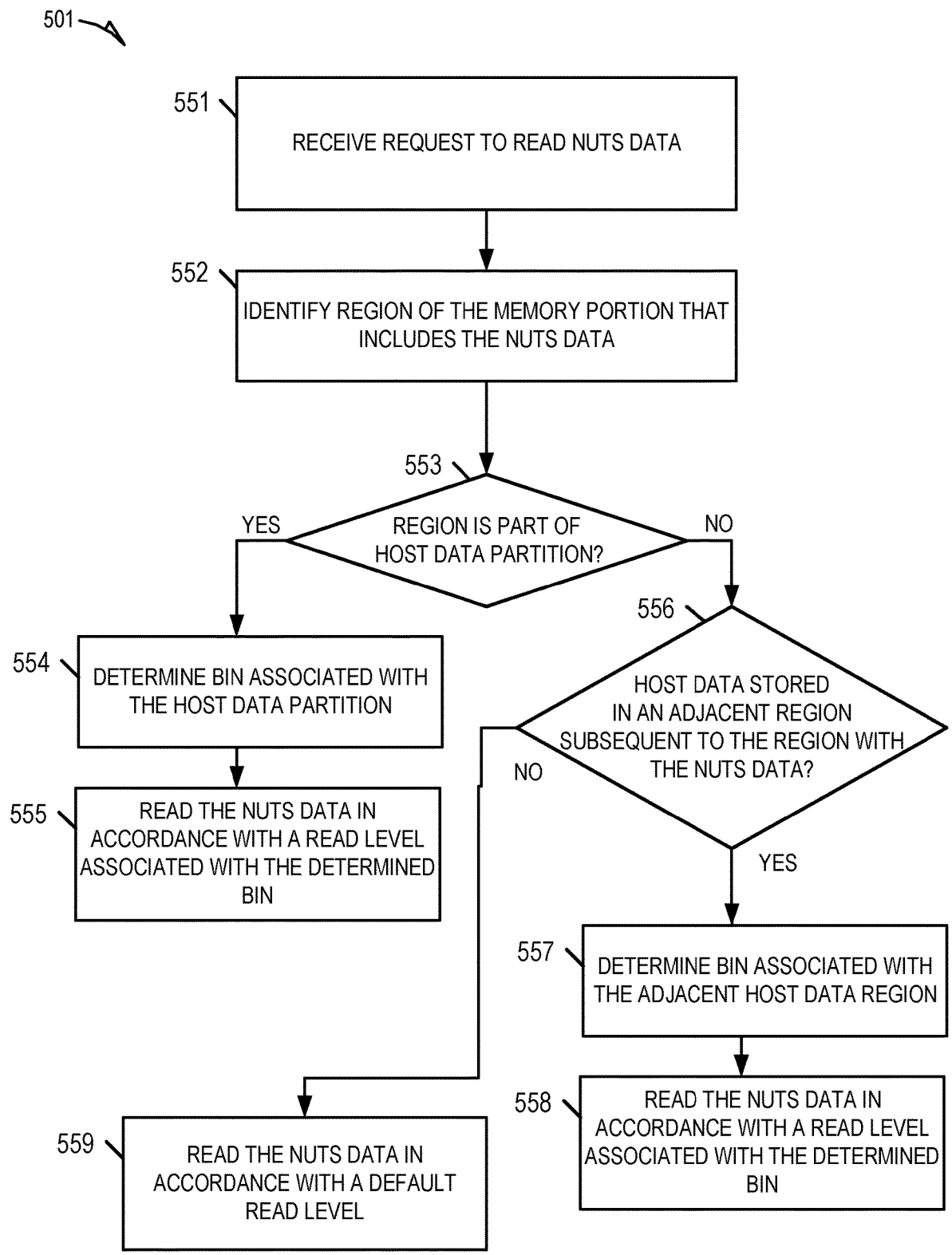

FIG. 5B is a flow diagram of an example method 501 to perform adaptive read level threshold voltage operations, in accordance with some implementations of the present disclosure. Method 501 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 501 is performed by the memory sub-system controller 115 or subcomponents of the controller 115 of FIG. 1. In these embodiments, the method 501 can be performed, at least in part, by the block partition module 200. Although the processes are shown in a particular sequence or order, unless otherwise specified, the order of the processes can be modified. Thus, the illustrated embodiments should be understood only as examples; the illustrated processes can be performed in a different order, and some processes can be performed in parallel. Additionally, one or more processes can be omitted in various embodiments. Thus, not all processes are required in every embodiment. Other process flows are possible.

Referring now to FIG. 5B, the method (or process) 501 begins at operation 551, with the block partition module 200 of a memory sub-system (e.g., of processor of the memory sub-system controller 115) receiving a request to read NUTS data. In response, the block partition module 200 identifies a region of the memory portion that includes the NUTS data at operation 552. The block partition module 200 determines whether the region is part of a host data partition at operation 553 and, if so, the block partition module 200 performs operation 554 to determine a bin associated with the host data partition. At operation 555, the block partition module 200 reads the NUTS data in accordance with a read level associated with the determined bin.

If the block partition module 200 determines at operation 553 that the region is not part of the host data partition, the block partition module 200 performs operation 556 to determine if host data is stored in an adjacent region subsequent (or previous) to the region with the NUTS data. The block partition module 200 performs operation 557 in response to determining that host data is stored in an adjacent region subsequent (or previous) to the region with the NUTS data. In operation 557, the block partition module 200 determines a bin associated with the adjacent (or previous) host data region and, at operation 558, the block partition module 200 read the NUTS data in accordance with a read level associated with the determined bin. In response to determining that host data is not stored in an adjacent region subsequent (or previous) to the region with the NUTS data in operation 556, the block partition module 200 performs operation 559 to read the NUTS data in accordance with a default read level (e.g., any one of the read levels stored in the level offset table 300 or the lowest or highest read level).

In view of the disclosure above, various examples are set forth below. It should be noted that one or more features of an example, taken in isolation or combination, should be considered within the disclosure of this application.

Example 1. A system comprising: a memory sub-system comprising a set of memory components; and a processing device, operatively coupled to the set of memory components and configured to perform operations comprising: receiving a request to program data into an individual portion of the set of memory components; determining whether the request comprises host data or non-user targeted space (NUTS) data; conditionally defining a partition for the individual portion of the set of memory components based on whether the request comprises host data or the NUTS data; and associating the partition with a bin of a plurality of bins, each of the plurality of bins representing an individual read level offset used to access a charge distribution of data stored in the individual portion of the set of memory components.

Example 2. The system of Example 1, the operations comprising: determining that the request comprises the host data; and in response to determining that the request comprises the host data, closing the partition after a specified time interval.

Example 3. The system of Example 2, wherein the bin is a first bin representing a first read level offset, and wherein the operations comprise: determining that the time interval associated with the bin has elapsed since a collection of data comprising the host data was initially programmed in the partition; and in response to determining that the time interval associated with the bin has elapsed, associating the partition with a second bin of the plurality of bins, the second bin representing a second read level offset.

Example 4. The system of any one of Examples 1-2, wherein the operations comprise: preventing additional data from being stored in the partition of the individual portion of the set of memory components in response to determining that the partition has been closed.

Example 5. The system of Example 4, wherein the partition is a first partition, and wherein the operations comprise: receiving a request to write additional host data to the individual portion of the set of memory components after the first partition has been closed; and in response to receiving the request to write the additional host data, programming the additional host data to a second partition of the individual portion of the set of memory components.

Example 6. The system of Example 5, wherein the operations comprise: initiating a timer for the second partition in response to receiving the request to program the additional host data; and closing the second partition in response to determining that the timer has reached the specified time interval.

Example 7. The system of any one of Examples 1-3, wherein the partition is a first partition, and wherein the operations comprise: receiving a request to write additional NUTS data to the individual portion of the set of memory components after the first partition has been closed; and in response to receiving the request to write the additional NUTS data, programming the additional NUTS data to a region of the individual portion of the set of memory components that follows the first partition.

Example 8. The system of Example 7, wherein the operations comprise: identifying an individual bin of the plurality of bins associated with a partition that is programmed in the individual portion following the region in which the additional NUTS data is programmed; and associating the individual bin with the region in which the additional NUTS data is programmed.

Example 9. The system of Example 8, wherein the operations comprise: reading the additional NUTS data from the region using a read level offset defined by the individual bin.

Example 10. The system of any one of Examples 1-9, wherein the operations comprise: determining that the request comprises the NUTS data; and in response to determining that the request comprises the NUTS data, programming the NUTS data into a region of the individual portion.

Example 11. The system of Example 10, wherein the operations comprise: determining whether any host data is stored in the individual portion prior to a specified time period; and in response to determining that no host data has been stored in the individual portion prior to the specified time period, folding the individual portion to refresh the region that includes the NUTS data.

Example 12. The system of any one of Examples 1-10, wherein the operations comprise: determining whether any host data is stored in the individual portion prior to a specified time period; and in response to determining that a set of host data has been stored in the individual portion prior to the specified time period, associating the region of the individual portion with an individual bin of the plurality of bins corresponding to the set of host data.

Example 13. The system of Example 12, wherein the operations comprise: determining that the set of host data has been programmed into the partition prior to programming the NUTS data; determining that NUTS data has been programmed prior to a closing time of the partition into which the set of host data has been programmed; and defining the partition to include the set of host data and the NUTS data, such that the set of host data and the NUTS data are associated with the individual bin.

Example 14. The system of any one of Examples 1-13, wherein the operations comprise: determining that the set of host data has been programmed into an individual partition of the individual portion after programming the NUTS data; identifying the individual bin of the plurality of bins associated with an individual partition comprising the set of host data; and associating the individual bin with the region in which the NUTS data is programmed.

Example 15. The system of any one of Examples 1-14, wherein the individual portion includes a superblock comprising a plurality of memory blocks across a plurality of memory dies.

Example 16. The system of any one of Examples 1-15, wherein the memory sub-system comprises a three-dimensional NAND storage device.

Example 17. The system of any one of Examples 1-16, wherein the operations comprise generating the partition for the individual portion in response to receiving the request to program host data.

Example 18. The system of any one of Examples 1-17, wherein the operations comprise skipping one or more pages of the individual portion that comprise NUTS data during at least one of a media scan operation or read disturb scan operation.

Methods and computer-readable storage medium with instructions for performing any one of the above Examples.

Figure 6:
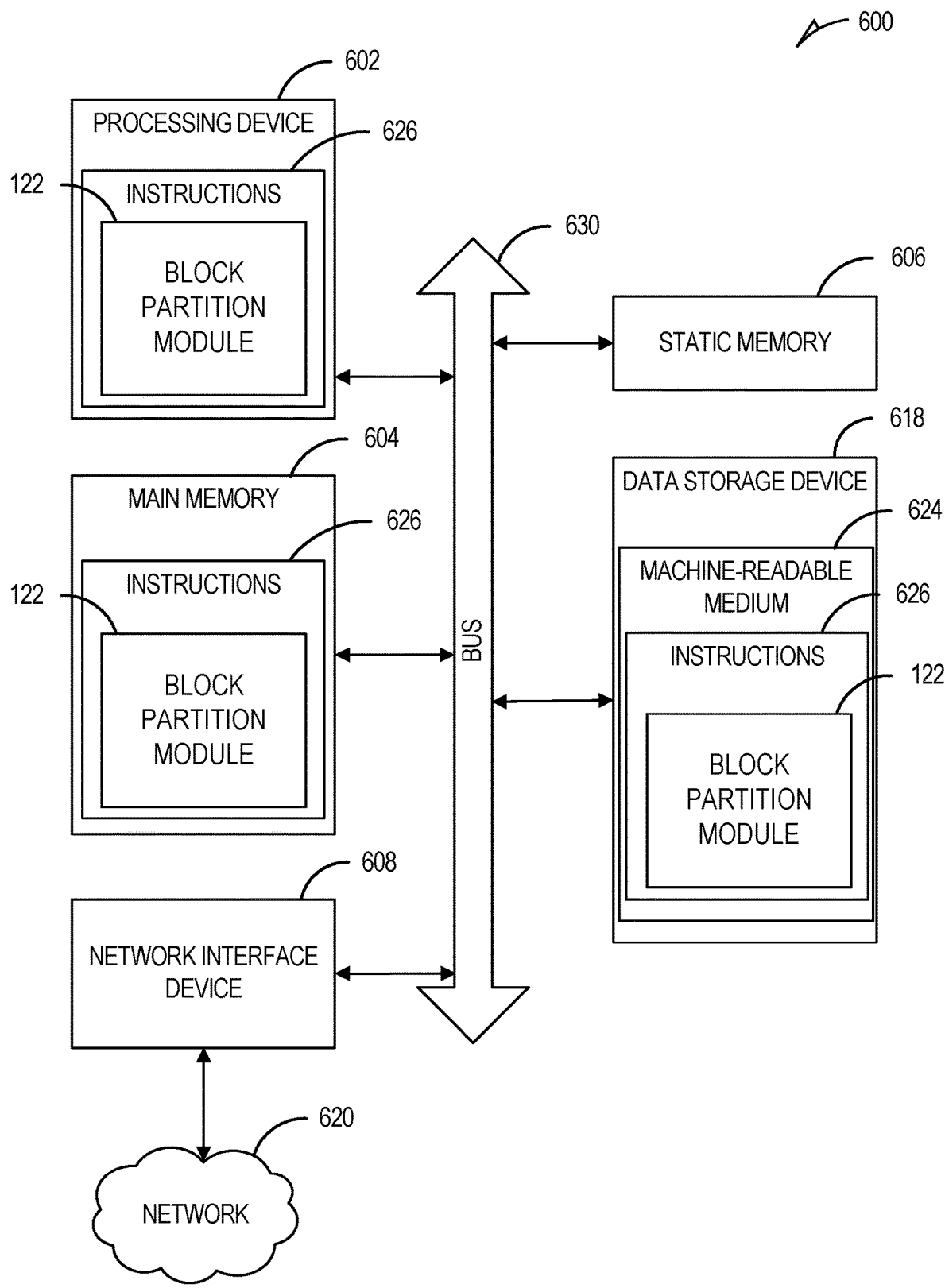
FIG. 6 is a block diagram illustrating a diagrammatic representation of a machine in the form of a computer system within which a set of instructions can be executed for causing the machine to perform any one or more of the methodologies discussed herein, in accordance with some embodiments of the present disclosure.

FIG. 6 illustrates an example machine in the form of a computer system 600 within which a set of instructions can be executed for causing the machine to perform any one or more of the methodologies discussed herein. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the block partition module 122 of FIG. 1). In alternative embodiments, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a network switch, a network bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

The processing device 602 represents one or more general-purpose processing devices such as a microprocessor, a central processing unit, or the like. More particularly, the processing device 602 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), a network processor, or the like. The processing device 602 is configured to execute instructions 626 for performing the operations and steps discussed herein. The computer system 600 can further include a network interface device 608 to communicate over a network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to the block partition module 122 of FIG. 1. While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system's memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks; read-only memories (ROMs); random access memories (RAMs); erasable programmable read-only memories (EPROMs); EEPROMs; magnetic or optical cards; or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description above. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine-readable (e.g., computer-readable) storage medium such as a read-only memory (ROM), random access memory (RAM), magnetic disk storage media, optical storage media, flash memory components, and so forth.

In the foregoing specification, embodiments of the disclosure have been described with reference to specific example embodiments thereof. It will be evident that various modifications can be made thereto without departing from the embodiments of the disclosure as set forth in the following claims. The specification and drawings are, accordingly, to be regarded in an illustrative sense rather than a restrictive sense.

What is claimed is:

1. A system comprising:
   a memory sub-system comprising a set of memory components; and
   a processing device, operatively coupled to the set of memory components and configured to perform operations comprising:
   receiving a request to program data into an individual portion of the set of memory components;
   determining whether the request comprises a first type of data or a second type of data;
   defining a partition for the individual portion of the set of memory components based on whether the request comprises the first type of data or the second type of data, the partition being for the individual portion being generated in response to receiving the request to program data corresponding to the first type of data, the first type of data comprising host data; and associating the partition with a bin of a plurality of bins, each of the plurality of bins representing an individual read level offset used to access a charge distribution of data stored in the individual portion of the set of memory components.

2. The system of claim 1, the operations comprising:
determining that the request comprises the host data; and
in response to determining that the request comprises the host data, closing the partition after a specified time interval.

3. The system of claim 2, wherein the bin is a first bin representing a first read level offset, and wherein the operations comprise:
determining that the time interval associated with the bin has elapsed since a collection of data comprising the host data was initially programmed in the partition; and
in response to determining that the time interval associated with the bin has elapsed, associating the partition with a second bin of the plurality of bins, the second bin representing a second read level offset.

4. The system of claim 2, wherein the operations comprise:
preventing additional data from being stored in the partition of the individual portion of the set of memory components in response to determining that the partition has been closed.

5. The system of claim 4, wherein the partition is a first partition, and wherein the operations comprise:
receiving a request to write additional host data to the individual portion of the set of memory components after the first partition has been closed; and
in response to receiving the request to write the additional host data, programming the additional host data to a second partition of the individual portion of the set of memory components.

6. The system of claim 5, wherein the operations comprise:
initiating a timer for the second partition in response to receiving the request to program the additional host data; and
closing the second partition in response to determining that the timer has reached the specified time interval.

7. The system of claim 3, wherein the partition is a first partition, and wherein the operations comprise:
receiving a request to write additional data corresponding to the second type of data to the individual portion of the set of memory components after the first partition has been closed; and
in response to receiving the request to write the additional data, programming the additional data to a region of the individual portion of the set of memory components that follows the first partition.

8. The system of claim 7, wherein the operations comprise:
identifying an individual bin of the plurality of bins associated with a partition that is programmed in the individual portion following the region in which the additional data is programmed; and
associating the individual bin with the region in which the additional data is programmed.

9. The system of claim 8, wherein the operations comprise:
reading the additional data from the region using a read level offset defined by the individual bin.

10. The system of claim 1, wherein the operations comprise:
determining that the request comprises a portion of data corresponding to the second type of data; and
in response to determining that the request comprises the portion of data, programming the portion of data into a region of the individual portion.

11. The system of claim 10, wherein the operations comprise:
determining whether any host data is stored in the individual portion prior to a specified time period; and
in response to determining that no host data has been stored in the individual portion prior to the specified time period, folding the individual portion to refresh the region that includes the portion of data.

12. The system of claim 10, wherein the operations comprise:
determining whether any host data is stored in the individual portion prior to a specified time period; and
in response to determining that a set of host data has been stored in the individual portion prior to the specified time period, associating the region of the individual portion with an individual bin of the plurality of bins corresponding to the set of host data.

13. The system of claim 12, wherein the operations comprise:
determining that the set of host data has been programmed into the partition prior to programming the portion of data;
determining that portion of data has been programmed prior to a closing time of the partition into which the set of host data has been programmed; and
defining the partition to include the set of host data and the portion of data, such that the set of host data and the portion of data are associated with the individual bin.

14. The system of claim 12, wherein the operations comprise:
determining that the set of host data has been programmed into an individual partition of the individual portion after programming the portion of data;
identifying the individual bin of the plurality of bins associated with an individual partition comprising the set of host data; and
associating the individual bin with the region in which the portion of data is programmed.

15. The system of claim 1, wherein the individual portion includes a superblock comprising a plurality of memory blocks across a plurality of memory dies, wherein the first type of data comprises the host data, and wherein the second type of data comprises data other than host data.

16. The system of claim 1, wherein the memory subsystem comprises a three-dimensional NAND storage device.

17. The system of claim 1, wherein the first type of data is of a type for which a partition closing time needs to be initiated, and wherein the second type of data is of a type that can be stored without generating any partition.

18. The system of claim 15, wherein the operations comprise skipping one or more pages of the individual portion that comprise a portion of data corresponding to the second type of data during at least one of a media scan operation or read disturb scan operation.

19. A method comprising:
receiving a request to program data into an individual portion of a set of memory components;
determining whether the request comprises a first type of data or a second type of data;

defining a partition for the individual portion of the set of memory components based on whether the request comprises the first type of data or the second type of data, the partition being for the individual portion being generated in response to receiving the request to program data corresponding to the first type of data, the first type of data comprising host data; and associating the partition with a bin of a plurality of bins, each of the plurality of bins representing an individual read level offset used to access a charge distribution of data stored in the individual portion of the set of memory components.

20. A non-transitory computer-readable storage medium comprising instructions that, when executed by a processing device, cause the processing device to perform operations comprising:

receiving a request to program data into an individual portion of a set of memory components;

determining whether the request comprises a first type of data or a second type of data;

defining a partition for the individual portion of the set of memory components based on whether the request comprises the first type of data or the second type of data, the partition being for the individual portion being generated in response to receiving the request to program data corresponding to the first type of data, the first type of data comprising host data; and associating the partition with a bin of a plurality of bins, each of the plurality of bins representing an individual read level offset used to access a charge distribution of data stored in the individual portion of the set of memory components.

* * * * *